(12) United States Patent
Lin et al.

(10) Patent No.: US 8,474,927 B2
(45) Date of Patent: Jul. 2, 2013

(54) ENCLOSURE HAVING DETACHABLE NUTS

(75) Inventors: Chieh-Hsiang Lin, Tu-Cheng (TW); Wen-Tang Peng, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 175 days.

(21) Appl. No.: 12/987,138

(22) Filed: Jan. 9, 2011

(65) Prior Publication Data

US 2012/0152945 A1 Jun. 21, 2012

(51) Int. Cl.
*A47B 97/00* (2006.01)

(52) U.S. Cl.
USPC ........................ 312/352; 312/223.1

(58) Field of Classification Search
USPC .. 312/223.2, 263, 265.5, 223.1, 352; 361/759
See application file for complete search history.

(56) References Cited

U.S. PATENT DOCUMENTS

| | | | | |
|---|---|---|---|---|
| 3,178,987 | A * | 4/1965 | Reese et al. | 411/523 |
| 3,812,756 | A * | 5/1974 | Wenger | 411/353 |
| 3,984,191 | A * | 10/1976 | Doty | 403/69 |
| 4,470,716 | A * | 9/1984 | Welch | 403/254 |
| 4,601,247 | A * | 7/1986 | Welch et al. | 108/152 |
| 4,786,119 | A * | 11/1988 | Smuda | 312/195 |
| 6,424,538 | B1 * | 7/2002 | Paquin | 361/752 |
| 6,695,629 | B1 * | 2/2004 | Mayer | 439/92 |
| 7,364,442 | B2 * | 4/2008 | Bang et al. | 439/92 |
| 7,385,830 | B2 * | 6/2008 | Liu et al. | 361/810 |
| 7,957,125 | B2 * | 6/2011 | Iwata | 361/679.07 |
| 8,120,923 | B2 * | 2/2012 | Cheng | 361/727 |
| 2005/0168116 | A1 * | 8/2005 | Chuang | 312/265.5 |
| 2012/0153784 | A1 * | 6/2012 | Lin et al. | 312/223.1 |

* cited by examiner

*Primary Examiner* — Hanh V Tran
(74) *Attorney, Agent, or Firm* — Altis Law Group, Inc.

(57) ABSTRACT

An enclosure includes a sidewall and a nut assembly. The sidewall defines a through hole therein. The nut assembly is detachably positioned on the sidewall. The nut assembly includes a nut and a resilient tab. The nut includes a base and a post extending from the base. The post extends through the through hole. The tab is secured on the post. The sidewall is sandwiched between the base and the tab.

12 Claims, 5 Drawing Sheets

ENCLOSURE HAVING DETACHABLE NUTS

BACKGROUND

1. Technical Field

The present disclosure relates to an enclosure, and particularly, to an enclosure having detachable nuts for facilitating assembling electronic elements to the enclosure.

2. Description of Related Art

Enclosures often have multiples nuts formed on inner surfaces thereof, whereby electronic elements can be fixed to the enclosures by extending screws therethrough into the nuts. Generally, when the electronic elements fixed on the enclosures are required to be replaced by other electronic elements which have different thicknesses from the original electronic elements, the nuts are also required to be replaced by other nuts due to the heights of the nuts failing to meet the thicknesses of the replaced electronic elements. However, conventional enclosures are generally made integrally with the nuts; that is to say, the whole enclosure should also be replaced as soon as replacement of the nuts. Such replacement of the whole enclosure is inconvenient and labor-waste.

What is needed, therefore, is a new enclosure which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
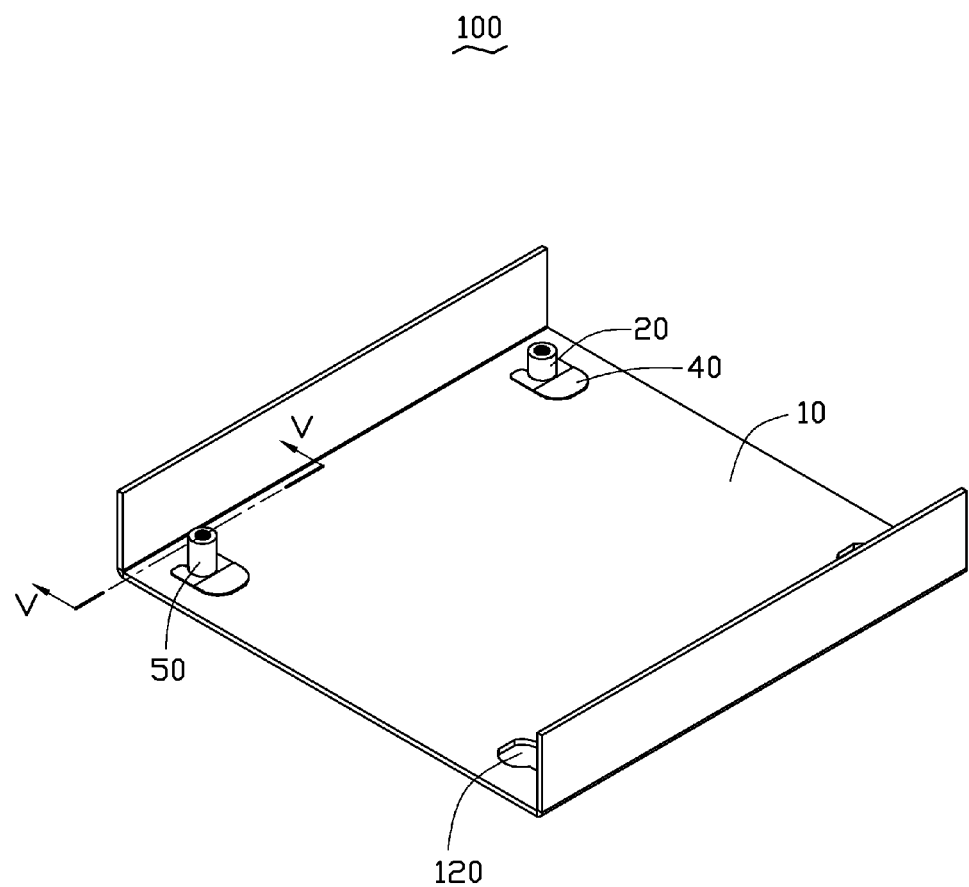
FIG. 1 shows a sidewall and two nut assemblies of an enclosure according to an embodiment of the present disclosure, wherein the two nut assemblies are mounted to the sidewall.
Figure 2:
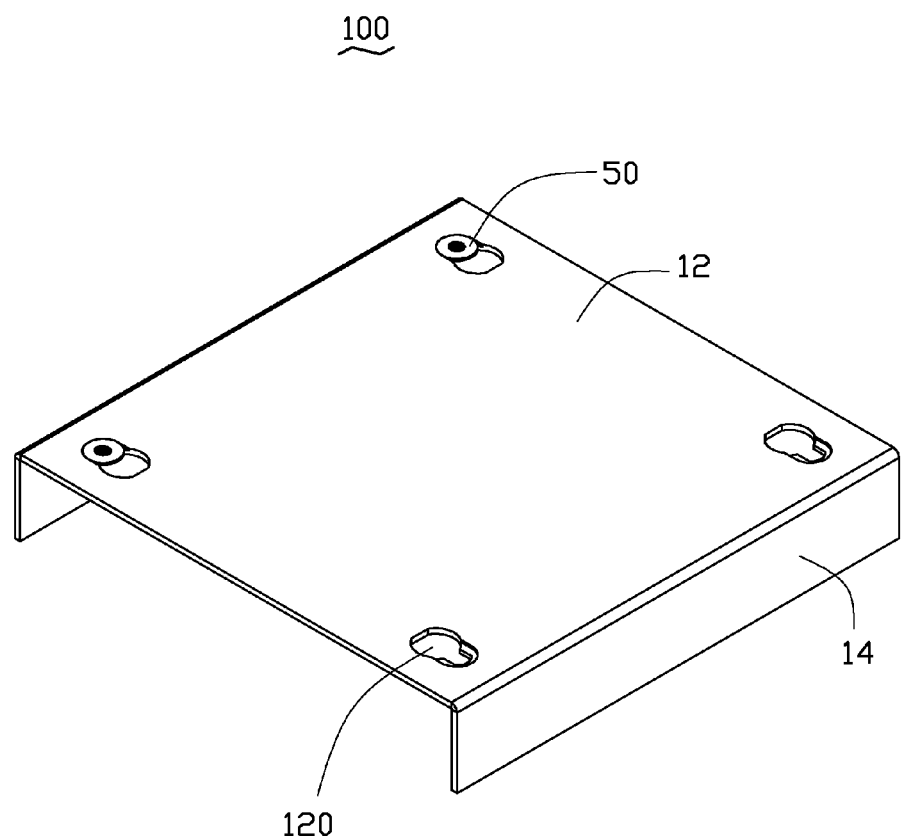
FIG. 2 is an inverted view of FIG. 1.

Referring to FIGS. 1-2, an enclosure 100 in accordance with an embodiment of the present disclosure is disclosed. The enclosure 100 includes a plurality of sidewalls 10 and a plurality of nut assemblies 50 mounted to the sidewalls 10, wherein one sidewall 10 and two nut assemblies 50 mounted on the sidewall 10 are taken as an example for discussion below.

Figure 3:
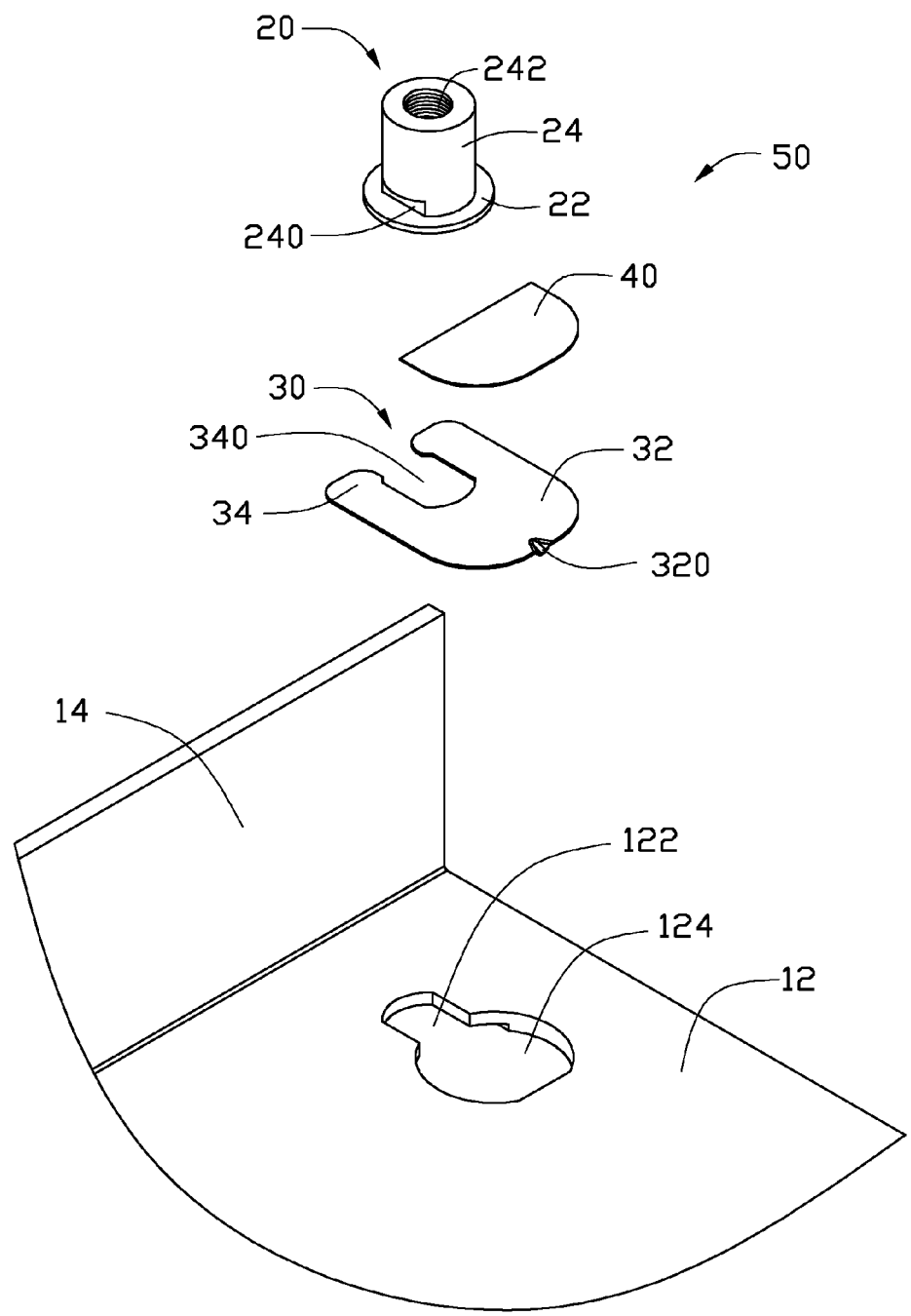
FIG. 3 is a partial, exploded view of the enclosure of FIG. 1, showing one exploded nut assembly and a corner of the sidewall.
Figure 4:
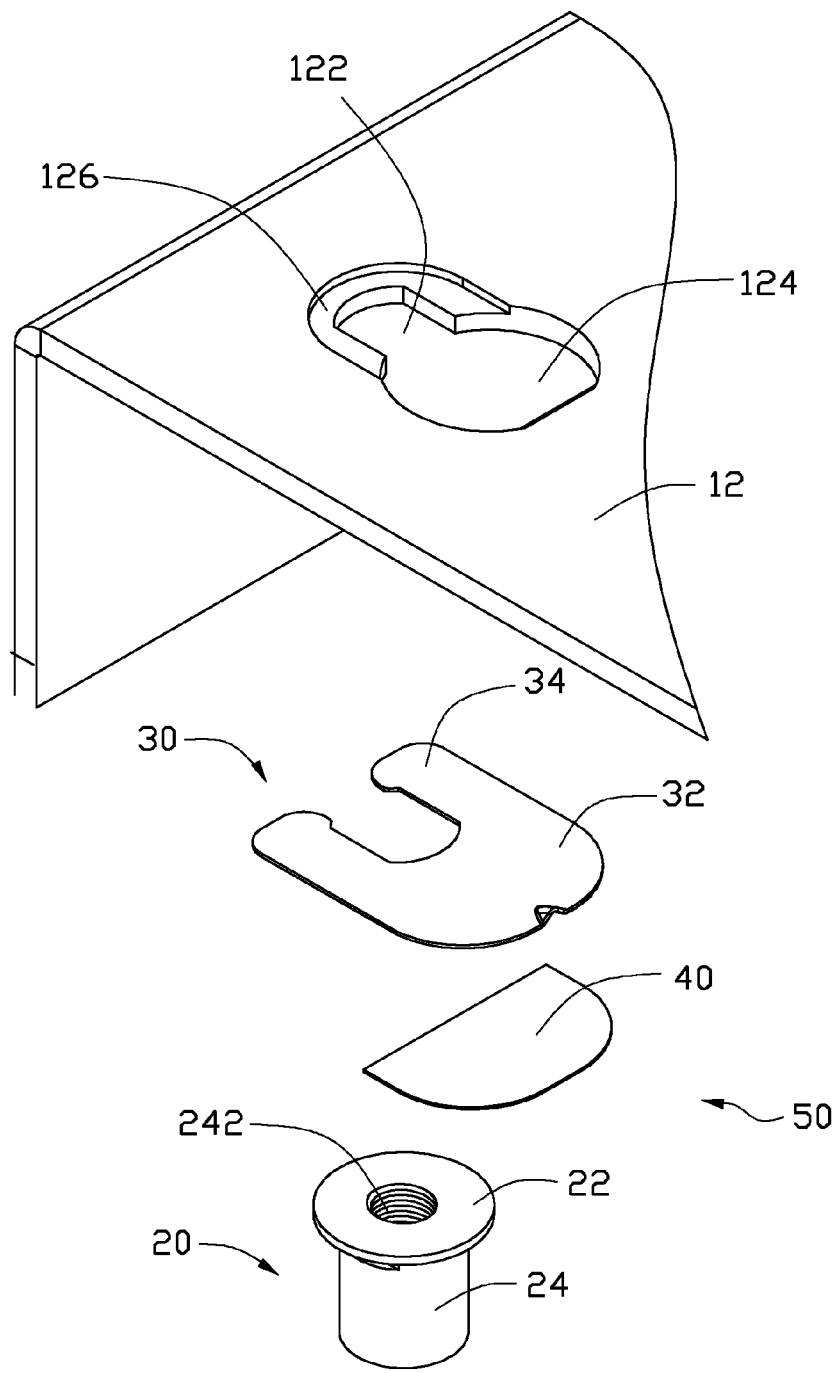
FIG. 4 is an inverted view of FIG. 3.

Also referring to FIGS. 3-4, the sidewall 10 includes a rectangular plate 12 and a pair of flanges 14 extending upwardly from two opposite sides of the plate 12. The plate 12 has four through holes 120 defined adjacent to four corners thereof for receiving four nut assemblies 50 therein (only two shown in FIGS. 1-2). Each hole 120 includes a first aperture 122 and a second aperture 124 communicating with the first aperture 122. The first aperture 122 has a shape similar to a rectangle with a curved side, and the second aperture 124 has a shape similar to a circle with a straight side opposite to the curved side of the first aperture 122. The first aperture 122 has a size smaller than that of the second aperture 124. The plate 12 forms four depressions 126 communicating with the four holes 120, respectively. Each depression 126 is located adjacent to the second aperture 124 and surrounds the first aperture 122 of a corresponding hole 120. Each depression 126 is defined in a bottom face of the plate 12 and terminated at ⅓ thickness of the plate 12; in other words, the hole 120 has a depth twice as that of the depression 126. Each depression 126 has an area smaller than that of the second aperture 124 and larger than that of the first aperture 122.

Figure 5:
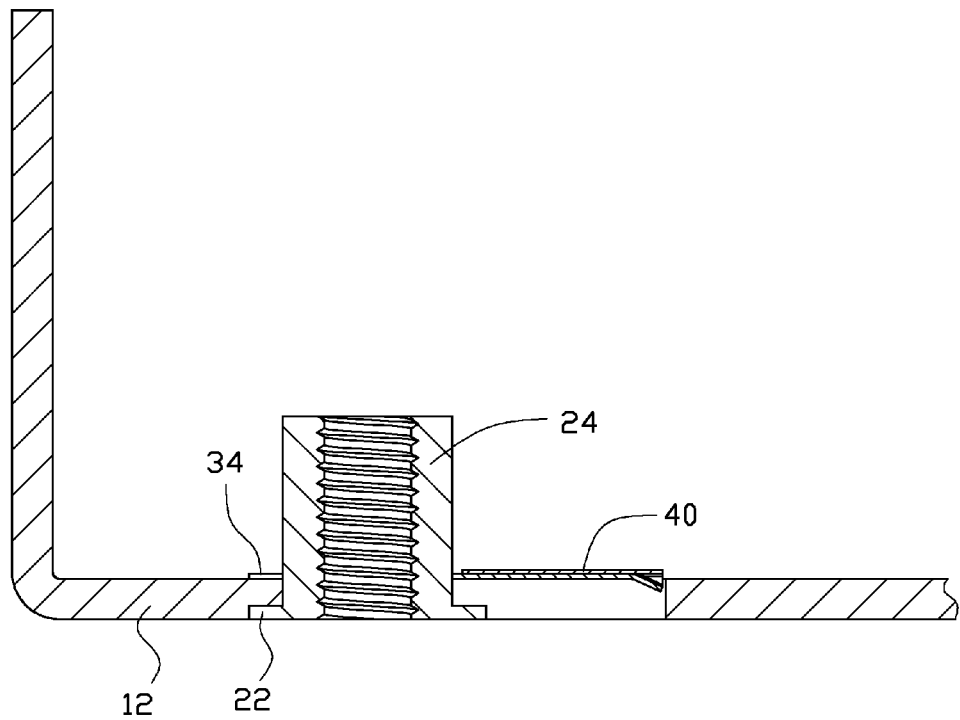
FIG. 5 is a cutaway view of FIG. 1 taken along line V-V.

Also referring to FIG. 5, each nut assembly 50 includes a nut 20 and a tab 30 attached to the nut 20. The nut 20 includes a base 22 and a post 24 extending upwardly and perpendicularly from a top face of the base 22. The base 22 is circular. The base 22 has an area larger than the first aperture 122 of the hole 120 and less than that of the depression 126 so that the base 22 can be received in the depression 126 and press against an inner face of the plate 12 around a periphery of the hole 120, to thereby prevent the nut 20 from falling from the hole 120. The post 24 is a circular column and has a cross-section area smaller than that of the first aperture 122 so that the post 24 can be received in the first aperture 122 of the hole 120. The nut 20 defines a threaded hole 242 in a central area thereof for threadedly engaging a screw (not shown) therein. The threaded hole 242 extends through the base 22 and the post 24. The post 24 further defines two slots 240 at two opposite sides of an outer circumferential surface thereof. Each slot 240 is located adjacent to the top face of the base 22. The threaded hole 242 is located between the two slots 240.

The tab 30 is made of a single piece of thin metal sheet so that the tab 30 is resilient and bendable. The tab 30 includes a sheet 32 and a pair of arms 34 extending from a side of the sheet 32. The sheet 32 has an area larger than that of the second aperture 124 of the hole 120, whereby the sheet 32 can cover the second aperture 124 by pressing against a top face of plate 12 surrounding a periphery the second aperture 124. The tab 30 forms a V-notch 320 at another side thereof opposite to the two arms 34 for facilitating operation of the tab 30. The two arms 34 are spaced from each other by a gap 340. The two arms 34 are used to be received in the two slots 240 for fixing the nut 20 to the tab 30. Two free ends of the two arms 34 are protruded towards each other for reliably retaining the tab 30 to the post 24 and thus preventing the two arms 34 from sliding out of the slots 240 of the post 24.

In assembly, the tab 30 is fixed to the nut 20, with the arms 34 clamping the post 24 and being received in the two slots 240. Then the nut 20 with the tab 30 are brought to extend upwardly through the hole 120 from a place below the plate 12. During insertion of the nut 20 through the hole 120, the tab 30 is depressed by the bottom face of the plate 12 and thus shrinks from two opposite sides thereof due to resilient deformation. Until the tab 30 shrinks to have an area smaller than that of the hole 120, the tab 30 is extended through the hole 120 and then restores to its original size by resilient force. After restoring, the tab 30 presses downwardly against the top face of the plate 12 and covers the second aperture 124 of the hole 120. The base 22 of the nut 20 presses upwardly against the inner face of the plate 12 surrounding the first aperture 122. The plate 12 is sandwiched between the tab 30 and the base 22 of the nut 20, whereby the nut assembly 50 is fixed to the sidewall 10. In disassembly of the nut assembly 50 from the sidewall 10, a process opposite to the above process can be implemented. Therefore, the nut assembly 50 is conveniently detachable with respect to the sidewall 10.

In another embodiment, the two nuts 20 can be coated with different colors. For example, a short one of the two nuts 20 can be coated with a red color, and a long one of the two nuts 20 can be coated with a green color. Furthermore, the tabs 30 attached to the two nuts 20 can also be attached with stickers 40 having different colors for facilitating further identification. The sticker 40 attached on the tab 30 has the same color with that of the nut 20 secured with the tab 30.

It is believed that the present disclosure will be understood from the foregoing description, and it will be apparent that various changes may be made thereto without departing from the spirit and scope of the present disclosure or sacrificing all of its material advantages, the examples hereinbefore described merely being exemplary embodiments.

What is claimed is:

1. An enclosure comprising:
    a sidewall comprising a plate defining a through hole and a depression therein, the through hole comprising a first aperture and a second aperture communicating with the first aperture, the depression surrounding the first aperture and communicating with the first aperture and the second aperture of the through hole; and
    a nut assembly detachably positioned on the sidewall, the nut assembly comprising a nut and a resilient tab, wherein the nut comprises a base and a post extending from the base, the base is received in the depression and presses against a bottom surface of the plate defining the depression, the post extends through the first aperture of the through hole, the tab is secured on the post, and the sidewall is sandwiched between the base and the tab.

2. The enclosure as claimed in claim 1, wherein the tab is made of a single piece of metal sheet.

3. The enclosure as claimed in claim 1, wherein the tab comprises a sheet and a pair of spaced arms extending from the sheet, and the arms clamp the post to secure the tab to the nut.

4. The enclosure as claimed in claim 3, wherein the post defines two slots in two opposite sides of a circumferential periphery thereof, and the arms are received in the two slots correspondingly.

5. The enclosure as claimed in claim 4, wherein the two slots are located adjacent to the base.

6. The enclosure as claimed in claim 1, wherein the nut defines a threaded hole extending through the base and the post.

7. The enclosure as claimed in claim 1, wherein the first aperture has an area smaller than that of the second aperture.

8. The enclosure as claimed in claim 1, wherein the tab covers the second aperture and presses against the plate.

9. The enclosure as claimed in claim 1, wherein the depression has an area smaller than that of the second aperture and larger than that of the first aperture.

10. The enclosure as claimed in claim 1, wherein the hole has a depth twice that of the depression.

11. The enclosure as claimed in claim 1, wherein the tab has a sticker attached thereon.

12. The enclosure as claimed in claim 1, wherein the tab defines a V-shaped notch in an end thereof.

* * * * *